(12) United States Patent
Yang et al.

(10) Patent No.: US 9,379,702 B2
(45) Date of Patent: Jun. 28, 2016

(54) SAMPLE AND HOLD SWITCH CIRCUIT

(71) Applicant: IPGoal Microelectronics (Sichuan) Co., Ltd., Chengdu (CN)

(72) Inventors: Baoding Yang, Chengdu (CN); Zhengxian Zou, Chengdu (CN)

(73) Assignee: IPGOAL MICROELECTRONICS (SICHUAN) CO., LTD., Chengdu, Sichuan (CN)

( * ) Notice: Subject to any disclaimer, the term of this patent is extended or adjusted under 35 U.S.C. 154(b) by 51 days.

(21) Appl. No.: 14/487,369

(22) Filed: Sep. 16, 2014

(65) Prior Publication Data

US 2015/0200663 A1 Jul. 16, 2015

(30) Foreign Application Priority Data

Jan. 16, 2014 (CN) .......................... 2014 1 0019223

(51) Int. Cl.

| | |
|---|---|
| *G11C 27/02* | (2006.01) |
| *H03K 5/00* | (2006.01) |
| *H03K 17/00* | (2006.01) |
| *H03K 17/687* | (2006.01) |
| *G11C 11/00* | (2006.01) |
| *H03K 17/14* | (2006.01) |
| *H03K 17/16* | (2006.01) |

(52) U.S. Cl.
CPC ............ *H03K 17/6871* (2013.01); *G11C 11/00* (2013.01); *H03K 17/145* (2013.01); *H03K 17/161* (2013.01); *H03K 2217/0054* (2013.01)

(58) Field of Classification Search
CPC .... G11C 27/026; G11C 27/024; G11C 27/02; G01R 13/342; H03K 17/063
USPC ............................... 327/91–97; 341/122–125
See application file for complete search history.

(56) References Cited

U.S. PATENT DOCUMENTS

| | | | | |
|---|---|---|---|---|
| 6,525,574 | B1 * | 2/2003 | Herrera ........................... | 327/94 |
| 7,183,814 | B2 * | 2/2007 | Kudo ............................... | 327/91 |
| 7,385,433 | B2 * | 6/2008 | Callahan, Jr. .................. | 327/534 |
| 8,525,574 | B1 * | 9/2013 | Duggal .......................... | 327/390 |
| 2009/0039851 | A1 * | 2/2009 | Fukushi et al. ................ | 323/283 |

* cited by examiner

*Primary Examiner* — Quan Tra
(74) *Attorney, Agent, or Firm* — Shimokaji IP

(57) ABSTRACT

A sample and hold switch circuit includes a clock generation sub-circuit, a gate voltage bootstrap unit, a sampling Field Effect Transistor, a holding capacitor and a substrate selection sub-circuit which is connected with a signal input terminal, a signal output terminal and a substrate of the sampling Field Effect Transistor and arranged for selecting the signal input terminal or the signal output terminal to connect with the substrate of the sampling Field Effect Transistor according to the voltages of the analog signal inputted and the analog signal outputted. The sample and hold switch circuit reduces nonlinearity of the sampling Field Effect Transistor caused by its gate-source voltage changing with input signal, and eliminates bulk effect of the sampling Field Effect Transistor, thereby improving linearity of the sampling Field Effect Transistor, and extending dynamic range of the sample and hold switch circuit.

5 Claims, 1 Drawing Sheet

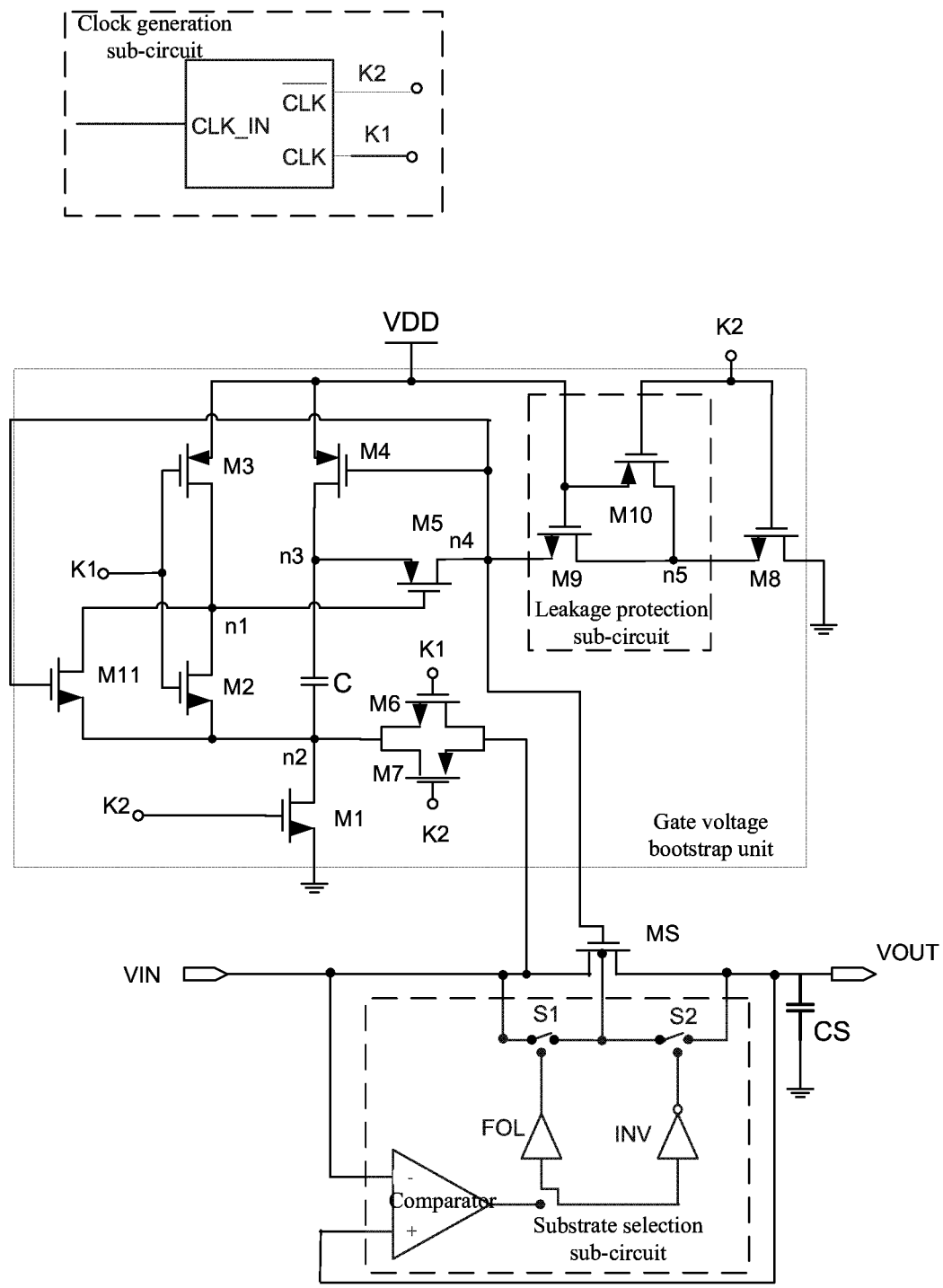

SAMPLE AND HOLD SWITCH CIRCUIT

RELATED APPLICATIONS

This application claims the benefit of priority to Chinese Patent Application No. 201410019223.2, filed on Jan. 16, 2014, which is hereby incorporated by reference in its entirety.

FIELD OF THE INVENTION

The present invention relates to a technical field of integrated circuits, more specifically to a sample and hold switch circuit for sampling an analog signal.

BACKGROUND OF THE INVENTION

In current high-speed and high-precision ADC (Analog-to-Digital Converter) circuits, the sample and hold switch circuit is a bottleneck for the converter design, and sampling Field Effect Transistors are an integral part of the sampling circuit, so the overall performance of the sample and hold switch circuit is largely depended on the speed and precision of the sampling Field Effect Transistor. In a condition of deep sub-micron technology, a gate voltage bootstrap frame is connected to the sampling Field Effect Transistor which is connected with an input signal so as to reduce on-resistance and nonlinearity of the sampling Field Effect Transistor and expand the input signal range. However, the linearity of the traditional sampling Field Effect Transistor declines with the increase of the sampling frequency, which restricts dynamic range of the sample and hold switch circuit, thereby it's hard to meet the demands of the dynamic performance of the sampling signal required by the high-speed and high-precision ADC.

Therefore, it is necessary to provide an improved sample and hold switch circuit to overcome the above drawbacks.

SUMMARY OF THE INVENTION

An objective of the present invention is to provide a sample and hold switch circuit to reduce nonlinearity of the sampling Field Effect Transistor caused by its gate-source voltage changing with input signal, and eliminate bulk effect of the sampling Field Effect Transistor, so as to further improve linearity of the sampling Field Effect Transistor and extend dynamic range of the sample and hold switch circuit.

To achieve the objective, a sample and hold switch circuit includes a clock generation sub-circuit, a gate voltage bootstrap unit, a sampling Field Effect Transistor, a holding capacitor and a substrate selection sub-circuit. The clock generation sub-circuit has a first output terminal and a second output terminal which are connected with the gate voltage bootstrap unit respectively, and the first output terminal and the second output terminal output two complementary clock pulses, the gate voltage bootstrap unit is connected with an external power source and having two output terminals which are connected with a gate and either of a drain and a source of the sampling Field Effect Transistor respectively to provide a fixed gate-source voltage for the sampling Field Effect Transistor; either of the drain and the source of the sampling Field Effect Transistor is connected with a signal input terminal to input an analog signal, and the other of the drain and the source of the sampling Field Effect Transistor is connected with a signal output terminal to output a sampled analog signal; one terminal of the holding capacitor is connected with the signal output terminal, and the other terminal of the holding capacitor is grounded, and the holding capacitor is arranged for holding the sampled analog signal; and the substrate selection sub-circuit is connected with the signal input terminal, the signal output terminal, and a substrate of the sampling Field Effect Transistor respectively, and arranged for selecting the signal input terminal or the signal output terminal to connect with the substrate of the sampling Field Effect Transistor according to the voltages of the analog signal inputted and the analog signal outputted, thereby eliminating bulk effect of the sampling Field Effect Transistor.

Preferably, the substrate selection sub-circuit comprises a comparator, a follower, an inverter, a first switch, and a second switch; the comparator has an inverting input terminal connected with the signal input terminal, a non-inverting input terminal connected with the signal output terminal, and an output terminal connected with input terminals of the follower and the inverter; one terminal of the first switch is connected with the signal input terminal, one terminal of the second switch is connected with the signal output terminal, and the other terminals of the first switch and the second switch are connected with the substrate of the sampling Field Effect Transistor; and an output terminal of the follower is connected with a control terminal of the first switch, and an output terminal of the inverter is connected with a control terminal of the second switch.

Preferably, both the first switch and the second switch are turned on if the voltage of their own control terminals is a high level, and turned off if the voltage of their own control terminals is a low level.

Preferably, the sampling Field Effect Transistor is an N-type Field Effect Transistor.

Preferably, the gate voltage bootstrap unit comprises a first Field Effect Transistor, a second Field Effect Transistor, a third Field Effect Transistor, a fourth Field Effect Transistor, a fifth Field Effect Transistor, a sixth Field Effect Transistor, a seventh Field Effect Transistor, an eighth Field Effect Transistor and a bootstrap capacitor, and the first output terminal of the clock generation sub-circuit is connected with gates of the second Field Effect Transistor and the third Field Effect Transistor, the second output terminal of the clock generation sub-circuit is connected with gates of the first Field Effect Transistor and the eighth Field Effect Transistor; one terminal of the bootstrap capacitor is connected with a drain of the first Field Effect Transistor and a source of the second Field Effect Transistor respectively, and the other terminal of the bootstrap capacitor is connected with a drain of the fourth Field Effect Transistor and a source of the fifth Field Effect Transistor respectively, a drain of the fifth Field Effect Transistor is grounded via a leakage protection sub-circuit and the eighth Field Effect Transistor, the external power source is connected with sources of the third Field Effect Transistor and the fourth Field Effect Transistor, a drain of the sixth Field Effect Transistor and a source of the seventh Field Effect Transistor are connected with either of the drain and the source of the sampling Field Effect Transistor, and a gate of the sampling Field Effect Transistor is connected with a drain of the fifth Field Effect Transistor and a gate of the fourth Field Effect Transistor respectively.

Preferably, the gate voltage bootstrap unit further comprises the leakage protection sub-circuit which is connected between the bootstrap capacitor and the ground, and the leakage protection sub-circuit is connected with the clock generation sub-circuit and the external power source respectively, and arranged for cutting a connection between the bootstrap capacitor and the ground when the sample and hold switch circuit is switched from holding to sampling.

Preferably, the leakage protection sub-circuit comprises a ninth Field Effect Transistor and a tenth Field Effect Transistor, a gate of the ninth Field Effect Transistor and a source of the tenth Field Effect Transistor are connected with the external power source, a source of the ninth Field Effect Transistor is connected with the drain of the fifth Field Effect Transistor, a drain of the ninth Field Effect Transistor is connected with the source of the eighth Field Effect Transistor, the second output terminal is connected with a gate of the tenth Field Effect Transistor, and a drain of the tenth Field Effect Transistor is connected with the source of the eighth Field Effect Transistor.

Preferably, the gate voltage bootstrap unit further comprises an eleventh Field Effect Transistor whose gate is connected with the gate of the fourth Field Effect Transistor, the drain of the fifth Field Effect Transistor and the source of the ninth Field Effect Transistor respectively, a drain of the eleventh Field Effect Transistor is connected with the drain of the third Field Effect Transistor, the drain of the second Field Effect Transistor and the gate of the fifth Field Effect Transistor respectively, and a source of the eleventh Field Effect Transistor is connected with one terminal of the bootstrap capacitor.

Preferably, the sixth Field Effect Transistor and the seventh Field Effect Transistor form a transmission gate, the first output terminal is connected with the gate of the sixth Field Effect Transistor, and the second output terminal is connected with the gate of the seventh Field Effect Transistor.

In comparison with the prior art, since the substrate selection sub-circuit is connected with the signal input terminal, the signal output terminal, and the substrate of the sampling Field Effect Transistor respectively, and selects the signal input terminal or the signal output terminal to connect with the substrate of the sampling Field Effect Transistor according to the voltages of the analog signal inputted and the analog signal outputted, thereby reversing the PN junction, and at the same time ensuring the on-resistance of the sampling Field Effect Transistor MS to be a constant related to process parameter and the voltage of the external power source, improving the linearity of the sampling Field Effect Transistor, and extending the dynamic range of the sample and hold switch circuit.

The present invention will become more apparent from the following detailed description when taken in conjunction with the accompanying drawings used to illustrate embodiments of the invention.

BRIEF DESCRIPTION OF THE DRAWINGS

FIG. 1 is a circuit diagram of the sample and hold switch circuit of the present invention.

DETAILED DESCRIPTION OF ILLUSTRATED EMBODIMENTS

Preferred embodiments of the present invention will be described taking in conjunction with the accompanying drawings below, and a similar component label in the drawings refers to a similar component. As noted above, the present invention provides a sample and hold switch circuit which reduces nonlinearity of the sampling Field Effect Transistor caused by its gate-source voltage changing with input signal changes, and at the same time eliminates bulk effect of the sampling Field Effect Transistor, further improves linearity of the sampling Field Effect Transistor, and extends dynamic range of the sample and hold switch circuit.

Please refer to FIG. 1, FIG. 1 is a circuit diagram of the sample and hold switch circuit according to the present invention. The sample and hold switch circuit of the present invention includes a clock generation sub-circuit, a gate voltage bootstrap unit, a sampling Field Effect Transistor MS, a holding capacitor CS and a substrate selection sub-circuit. The clock generation sub-circuit has a first output terminal K1 and a second output terminal K2 which are connected with the gate voltage bootstrap unit respectively, and the first output terminal K1 and the second output terminal K2 output two complementary clock pulses, that is if the first output terminal K1 outputs a high level, then the second output terminal K2 outputs a low level; moreover, jumps of the levels outputted from the first output terminal K1 and the second output terminal K2 are opposite, that is if the level outputted from the first output terminal K1 jumps to a high level from a low level, then the level outputted from the second output terminal K2 jumps to a low level from a high level. Furthermore, the gate voltage bootstrap unit is also connected with an external power source VDD and the sampling Field Effect Transistor MS respectively, and two output terminals of the gate voltage bootstrap unit are connected with a gate and either of a drain and a source of the sampling Field Effect Transistor MS (the sampling Field Effect Transistor MS of the present invention doesn't distinguish a source or a drain, that is the source and drain are interchangeable) respectively to provide a fixed gate-source voltage for the sampling Field Effect Transistor MS, thereby the gate-source voltage of the sampling Field Effect Transistor MS will not change with the analog signal inputted, thus reducing the nonlinearity caused by the gate-source voltage changes. A signal input terminal VIN is connected with either of the drain and the source of the sampling Field Effect Transistor MS for the purpose of inputting an analog signal Vin to the sampling Field Effect Transistor MS, and the other of the drain and the source of the sampling Field Effect Transistor MS is connected with a signal output terminal VOUT to output a sampled analog signal Vout. Concretely, one terminal of the holding capacitor CS is connected with the signal output terminal VOUT, and the other terminal is grounded, so that the holding capacitor CS can hold the sampled analog signal Vout outputted from the sampling Field Effect Transistor MS, thereby facilitating further processing for the sampled analog signal Vout made by follow-up circuits. Furthermore, the substrate selection sub-circuit is connected with the signal input terminal VIN, the signal output terminal VOUT, and the substrate of the sampling Field Effect Transistor MS respectively, and the substrate selection sub-circuit is arranged for selecting the signal input terminal VIN or the signal output terminal VOUT to connect with the substrate of the sampling Field Effect Transistor MS according to the voltages of the analog signal Vin and the analog signal Vout, thereby eliminating bulk effect of the sampling Field Effect Transistor MS.

Concretely, please refer to FIG. 1.

The gate voltage bootstrap unit includes a first Field Effect Transistor M1, a second Field Effect Transistor M2, a third Field Effect Transistor M3, a fourth Field Effect Transistor M4, a fifth Field Effect Transistor M5, a sixth Field Effect Transistor M6, a seventh Field Effect Transistor M7, an eighth Field Effect Transistor M8, a bootstrap capacitor C, and a leakage protection sub-circuit. Concretely, a gate of the first Field Effect Transistor M1 is connected with the second output terminal K2 of the clock generation sub-circuit, a source of the first Field Effect Transistor M1 is grounded, and a drain of the first Field Effect Transistor M1, one terminal of the bootstrap capacitor C, a source of the second Field Effect Transistor M2, a source of the sixth Field Effect Transistor M6 and a drain of the seventh Field Effect Transistor M7 are jointly connected to form a node n2; a gate of the second Field Effect Transistor M2 is connected with the first output terminal K1, and a drain of the second Field Effect Transistor M2, a drain of the third Field Effect Transistor M3 and a gate of the fifth Field Effect Transistor M5 are jointly connected to form a node n1; a gate of the third Field Effect Transistor M3 is connected with the first output terminal K1, a source of the third Field Effect Transistor M3 is connected with the external power source VDD; a source of the fourth Field Effect Transistor M4 is connected with the external power source VDD, and a gate of the fourth Field Effect Transistor M4, a drain of the fifth Field Effect Transistor M5, the leakage protection sub-circuit, the sampling Field Effect Transistor MS are jointly connected to form a node n4, a drain of the fourth Field Effect Transistor M4 is connected with a source of the fifth Field Effect Transistor M5 and the other terminal of the bootstrap capacitor C to form a node n3; a gate of the sixth Field Effect Transistor M6 is connected with the first output terminal K1, a source of the sixth Field Effect Transistor M6 is connected with a drain of the seventh Field Effect Transistor M7, and a drain of the sixth Field Effect Transistor M6 is connected with a source of the seventh Field Effect Transistor M7 and the sampling Field Effect Transistor MS respectively; a gate of the seventh Field Effect Transistor M7 is connected with the second output terminal K2, and a transmission gate is formed by the sixth Field Effect Transistor M6 and the seventh Field Effect Transistor M7; a gate of the eighth Field Effect Transistor M8 is connected with the second output terminal K2, a source of the eighth Field Effect Transistor M8 is connected to the node n4 via the leakage protection sub-circuit, and a drain of the eighth Field Effect Transistor M8 is grounded.

The gate of the sampling Field Effect Transistor MS is connected with the node n4, and either of the source and the drain of the sampling Field Effect Transistor MS is connected with the drain of the sixth Field Effect Transistor M6 and the signal input terminal VIN, thereby the bootstrap capacitor C provides a gate-source voltage for the sampling Field Effect Transistor MS via the node n4 and the transmission gate; in addition, the other of the source and the drain of the sampling Field Effect Transistor MS is connected with the signal output terminal VOUT, thereby the sampling Field Effect Transistor MS samples the analog signal Vin inputted from the signal input terminal VIN, and outputs the sampled analog signal Vout through the signal output terminal VOUT under controls of the clock pulses generated by the clock generation sub-circuit. And in preferred embodiments of the present invention, the sampling Field Effect Transistor MS is an N-type Field Effect Transistor. As noted above, the holding capacitor CS is connected between the other of the source and the drain of the sampling Field Effect Transistor MS and the signal output terminal VOUT, thereby when the sampling Field Effect Transistor MS stops sampling the analog signal Vin, the holding capacitor CS holds the sampled analog signal Vout on itself.

The leakage protection sub-circuit includes a ninth Field Effect Transistor M9 and a tenth Field Effect Transistor M10, a gate of the ninth Field Effect Transistor M9 and a source of the tenth Field Effect Transistor M10 are connected with the external power source VDD, a source of the ninth Field Effect Transistor M9 is connected with the drain of the fifth Field Effect Transistor M5, a drain of the ninth Field Effect Transistor M9 is connected with the source of the eighth Field Effect Transistor M8, the second output terminal K2 is connected with a gate of the tenth Field Effect Transistor M10, a drain of the tenth Field Effect Transistor M10 is connected with the source of the eighth Field Effect Transistor M8; and structural features of the eighth Field Effect Transistor M8 and the ninth Field Effect Transistor M9 are identical, thus the drain-source voltage of the eighth Field Effect Transistor M8 is lower than the external power source VDD, thereby avoiding withstand voltage problems of the eighth Field Effect Transistor M8.

The substrate selection sub-circuit includes a comparator, a follower FOL, an inverter INV, a first switch S1, and a second switch S2; and the comparator has an inverting input terminal connected with the signal input terminal VIN, a non-inverting input terminal connected with the signal output terminal VOUT, and an output terminal connected with input terminals of the follower FOL and the inverter INV; one terminal of the first switch S1 is connected with the signal input terminal VIN, one terminal of the second switch S2 is connected with the signal output terminal VOUT, and the other terminals of the first switch S1 and the second switch S2 are connected with the substrate of the sampling Field Effect Transistor MS; and an output terminal of the follower FOL is connected with a control terminal of the first switch S1, an output terminal of the inverter INV is connected with a control terminal of the second switch S2, thereby the voltage outputted from the follower FOL controls the first switch S1 to turn on or turn off, and the voltage outputted from the inverter INV controls the second switch S2 to turn on or turn off. And in preferred embodiments of the present invention, both the first switch S1 and the second switch S2 are turned on if the voltage of their own control terminals is a high level and turned off if the voltage of their own control terminals is a low level; thus the first switch S1 is turned on and the second switch S2 is turned off if the comparator outputs a high level, thereby the substrate of the sampling Field Effect Transistor MS is connected to the signal input terminal VIN, otherwise, the first switch S1 is turned off and the second switch S2 is turned on if the comparator outputs a low level, thereby the substrate of the sampling Field Effect Transistor MS is connected to the signal output terminal VOUT.

In preferred embodiments of the present invention, the gate voltage bootstrap unit further includes an eleventh Field Effect Transistor M11 whose gate is connected with the node n4, and the source of the eleventh Field Effect Transistor M11 is connected with the node n2, and the drain of the eleventh Field Effect Transistor M11 is connected with the node n1; and the eleventh Field Effect Transistor M11 is arranged for avoiding the withstand voltage problems of the fifth Field Effect Transistor M5, making the sample and hold switch circuit to work reliably.

The working principle of the present invention is described following by combination with the FIG. 1.

When the sample and hold switch circuit works in holding status, the first output terminal K1 outputs a low level, the second output terminal K2 outputs a high level; at this time, the first Field Effect Transistor M1 is turned on, the transmission gate composed by the sixth Field Effect Transistor M6 and the seventh Field Effect Transistor M7 is turned off, thereby the connection between the node n2 and the signal input terminal VIN is cut off, and the voltage of the node n2 is grounded via the first Field Effect Transistor M1; at the same time, the node n1 has a high level, and the fifth Field Effect Transistor M5 is turned off. And since the second output terminal K2 outputs a high level, thus the ninth Field Effect Transistor M9 and the eighth Field Effect Transistor M8 are turned on, the tenth Field Effect Transistor M10 is turned off, thereby the node n4 has a low level, resulting in the sampling Field Effect Transistor MS being turned off, the eleventh Field Effect Transistor M11 being turned off, and the fourth Field Effect Transistor M4 being turned on, therefore the external power source VDD charges the bootstrap capacitor C to a voltage of VDD−|VDS4|−VDS1 via the fourth Field Effect Transistor M4 and the first Field Effect Transistor M1, the VDS4 is a drain-source voltage of the fourth Field Effect Transistor M4, and the VDS1 is a drain-source voltage of the first Field Effect Transistor M1. Furthermore, when the sample and hold switch circuit samples, the first output terminal K1 outputs a high level, and the second output terminal K2 outputs a low level; thus the first Field Effect Transistor M1 is turned off, the transmission gate composed by the sixth Field Effect Transistor M6 and the seventh Field Effect Transistor M7 is turned on and connected to the signal input terminal VIN, then the voltage of the node n2 is VIN+VDS6. And since the second output terminal K2 outputs a low level, thus the eighth Field Effect Transistor M8 is turned off, the tenth Field Effect Transistor M10 is turned on, thereby the ninth Field Effect Transistor M9 is turned off instantaneously, and the node n1 has a low level at the moment, so the fifth Field Effect Transistor M5 is turned on, and further because the voltage of the bootstrap capacitor C cannot be changed instantaneously, so the present voltage of the node n4 is:

$$Vn4=VIN+VDS6+VDD-|VDS4|-VDS1 \quad (1)$$

Thereby the gate-source voltage VGS of the sampling Field Effect Transistor MS is:

$$VGS=Vn4-VIN=VDS6+VDD-|VDS4|-VDS1 \approx VDD \quad (2)$$

Because all the Field Effect Transistors in the circuit are switch tubes, and their drain-source voltages are very small if turned on, so VGS in the formula (2) is approximately equal to VDD, that is the gate-source voltage VGS of the sampling Field Effect Transistor MS is identically equal to VDD when sampling, thereby the on-resistance $R_S$ of the sampling Field Effect Transistor MS when it samples is:

$$R_S = \frac{1}{k(W/L)_S(VDD-VTH)} \quad (3)$$

The k in the formula (3) is a constant related to process parameter, the $(W/L)_S$ refers to a width to length ratio of the sampling Field Effect Transistor MS, and the VTH is a threshold voltage of the sampling Field Effect Transistor MS. And it can be seen from the formula (1) that the impedance of the $R_S$ has no relationship with the analog signal Vin, and the gate-source voltage is equal to the power source VDD, so compared with traditional structures, the equivalent impedance is greatly reduced, the sampling rate and linearity of the sampling Field Effect Transistor MS are improved, thereby improving sampling precision of the ADC circuit.

In the formula (3), the threshold voltage of the sampling Field Effect Transistor MS is:

$$VTH=VTH0+\gamma(\sqrt{|2\Phi_F+V_{SB}|}-\sqrt{|2\Phi_F|}) \quad (4)$$

The VTH0 in the formula (4) is a constant related to the process parameter, the γ is a bulk effect coefficient, the $\Phi_F$ is a static balance potential energy barrier (Fermi level) of semiconductor, the $V_{SB}$ is a potential difference between the source and the substrate of the sampling Field Effect Transistor MS. And in the present invention, the source and the drain of the sampling Field Effect Transistor MS are interchangeable; if Vin<Vout, the terminal of the sampling Field Effect Transistor MS connected with the signal input terminal VIN is its source, and the terminal of the sampling Field Effect Transistor MS connected with the signal output terminal VOUT is its drain; otherwise, if Vin>Vout, the terminal of the sampling Field Effect Transistor MS connected with the signal input terminal VIN is its drain, and the terminal of the sampling Field Effect Transistor MS connected with the signal output terminal VOUT is its source. Moreover, when the actual sampled signal changes constantly, it's impossible to determine the source of the sampling Field Effect Transistor MS, and in order to ensure normal working of the sampling Field Effect Transistor MS, it's required to reverse the PN junction. The substrate of the traditional NMOS sampling Field Effect Transistor is connected to the lowest level, that is the substrate is grounded, thereby ensuring the normal working of the MOS transistor even if the source and the drain may be interchangeable. However, in the circuits, the value of the $V_{SB}$ is inconstant, and it can be seen by combination with the formula (3) that when using the gate voltage bootstrap unit, the on-resistance of the traditional MOS sampling Field Effect Transistor MS still varies with differences of the signal inputted. But after adding the substrate selection sub-circuit, situation is different, as explained in the following text.

If the voltage relationship of the analog signal Vin inputted and the analog signal Vout outputted is: Vin<Vout, then the comparison result of the comparator is a high level, that is the comparator outputs a high level, at this time, the follower FOL outputs a high level accordingly, the first switch S1 is turned on, the inverter INV outputs a low level, in turns, the second switch S2 is turned off, and the substrate of the sampling Field Effect Transistor MS is connected to the signal input terminal VIN. Otherwise, if Vin>Vout, then the comparison result of the comparator is a low level, that is the comparator outputs a low level, at this time, the follower FOL outputs a low level accordingly, in turns, the first switch S1 is turned off, the inverter INV outputs a high level, the second switch S2 is turned on, and the substrate of the sampling Field Effect Transistor MS is connected to the signal output terminal VOUT. Therefore, the sampling Field Effect Transistor MS can always be connected to the lower one of the analog signal Vin and the analog signal Vout in any event, that is the sampling Field Effect Transistor MS is connected to the analog signal Vin inputted if the analog signal Vin is lower than the analog signal Vout, and connected to the analog signal Vout if the analog signal Vout is lower than the analog signal Vin, thereby ensuring the PN junction be reversed. Moreover, in the present invention, by taking an NMOS transistor as the sampling Field Effect Transistor MS, the terminal with lower voltage is served as the source of the sampling Field Effect Transistor MS to connect with its substrate by comparing the voltage of the analog signals Vin and Vout, so that the potential difference VSB between the source and the substrate of the NMOS sampling Field Effect Transistor MS is equal to 0, thus after adding the substrate selection sub-circuit, the threshold voltage of the sampling Field Effect Transistor MS as showed in the formula (4) is a constant related to process parameter, so that the on-resistance of the sampling Field Effect Transistor MS as showed in the formula (3) also is a constant related to the process parameter and the voltage of the power source VDD, thereby improving the linearity of the sampling Field Effect Transistor, and extending the dynamic range of the sample and hold switch circuit.

While the present invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A sample and hold switch circuit, comprising a clock generation sub-circuit, a gate voltage bootstrap unit, a sampling Field Effect Transistor, a holding capacitor and a substrate selection sub-circuit, the clock generation sub-circuit having a first output terminal and a second output terminal which are connected with the gate voltage bootstrap unit respectively, and the first output terminal and the second output terminal outputting two complementary clock pulses;

the gate voltage bootstrap unit being connected with an external power source and having an output terminal connected with a gate of the sampling Field Effect Transistor and an input terminal connected with either of a drain and a source of the sampling Field Effect Transistor to provide a fixed gate-source voltage for the sampling Field Effect Transistor;

either of the drain and the source of the sampling Field Effect Transistor being connected with a signal input terminal to input an analog signal, and the other of the drain and the source of the sampling Field Effect Transistor being connected with a signal output terminal to output a sampled analog signal;

one terminal of the holding capacitor being connected with the signal output terminal, and the other terminal of the holding capacitor being grounded, for holding the sampled analog signal; and the substrate selection sub-circuit being connected with the signal input terminal, the signal output terminal, and a substrate of the sampling Field Effect Transistor respectively, and arranged for selecting the signal input terminal or the signal output terminal to connect with the substrate of the sampling Field Effect Transistor according to the voltages of the analog signal inputted and the analog signal outputted, thereby eliminating bulk effect of the sampling Field Effect Transistor;

wherein the substrate selection sub-circuit comprises a comparator, a follower, an inverter, a first switch, and a second switch; the comparator has an inverting input terminal connected with the signal input terminal, a non-inverting input terminal connected with the signal output terminal, and an output terminal connected with input terminals of the follower and the inverter; one terminal of the first switch is connected with the signal input terminal, one terminal of the second switch is connected with the signal output terminal, and the other terminals of the first switch and the second switch are connected with the substrate of the sampling Field Effect Transistor; and an output terminal of the follower is connected with a control terminal of the first switch, and an output terminal of the inverter is connected with a control terminal of the second switch;

the gate voltage bootstrap unit comprises a first Field Effect Transistor, a second Field Effect Transistor, a third Field Effect Transistor, a fourth Field Effect Transistor, a fifth Field Effect Transistor, a sixth Field Effect Transistor, a seventh Field Effect Transistor, an eighth Field Effect Transistor and a bootstrap capacitor, and the first output terminal of the clock generation sub-circuit is connected with gates of the second Field Effect Transistor and the third Field Effect Transistor, the second output terminal of the clock generation sub-circuit is connected with gates of the first Field Effect Transistor and the eighth Field Effect Transistor; one terminal of the bootstrap capacitor is connected with a drain of the first Field Effect Transistor and a source of the second Field Effect Transistor respectively, and the other terminal of the bootstrap capacitor is connected with a drain of the fourth Field Effect Transistor and a source of the fifth Field Effect Transistor respectively, a drain of the fifth Field Effect Transistor is grounded via a leakage protection sub-circuit and the eighth Field Effect Transistor, the external power source is connected with sources of the third Field Effect Transistor and the fourth Field Effect Transistor, a drain of the sixth Field Effect Transistor and a source of the seventh Field Effect Transistor are connected with either of the drain and the source of the sampling Field Effect Transistor, and a gate of the sampling Field Effect Transistor is connected with a drain of the fifth Field Effect Transistor and a gate of the fourth Field Effect Transistor respectively;

and the gate voltage bootstrap unit further comprises the leakage protection sub-circuit which is connected between the bootstrap capacitor and the ground, and the leakage protection sub-circuit is connected with the clock generation sub-circuit and the external power source respectively, and arranged for cutting a connection between the bootstrap capacitor and the ground when the sample and hold switch circuit is switched from holding to sampling.

2. The sample and hold switch circuit according to claim 1, wherein both the first switch and the second switch are turned on if the voltage of their own control terminals is a high level, and turned off if the voltage of their own control terminals is a low level.

3. The sample and hold switch circuit according to claim 1, wherein the leakage protection sub-circuit comprises a ninth Field Effect Transistor and a tenth Field Effect Transistor, a gate of the ninth Field Effect Transistor and a source of the tenth Field Effect Transistor are connected with the external power source, a source of the ninth Field Effect Transistor is connected with the drain of the fifth Field Effect Transistor, a drain of the ninth Field Effect Transistor is connected with the source of the eighth Field Effect Transistor, the second output terminal is connected with a gate of the tenth Field Effect Transistor, and a drain of the tenth Field Effect Transistor is connected with the source of the eighth Field Effect Transistor.

4. The sample and hold switch circuit according to claim 3, wherein the gate voltage bootstrap unit further comprises an eleventh Field Effect Transistor whose gate is connected with the gate of the fourth Field Effect Transistor, the drain of the fifth Field Effect Transistor and the source of the ninth Field Effect Transistor respectively, a drain of the eleventh Field Effect Transistor is connected with the drain of the third Field Effect Transistor, the drain of the second Field Effect Transistor and the gate of the fifth Field Effect Transistor respectively, and a source of the eleventh Field Effect Transistor is connected with one terminal of the bootstrap capacitor.

5. The sample and hold switch circuit according to claim 3, wherein the sixth Field Effect Transistor and the seventh Field Effect Transistor form a transmission gate, the first output terminal is connected with the gate of the sixth Field Effect Transistor, and the second output terminal is connected with the gate of the seventh Field Effect Transistor.

* * * * *